(12) United States Patent
Choi et al.

(10) Patent No.: US 12,230,341 B2
(45) Date of Patent: Feb. 18, 2025

(54) SEMICONDUCTOR DEVICE PERFORMING DATA READ OPERATION AND CONTROLLER CONTROLLING THE SAME

(71) Applicant: SK hynix Inc., Icheon-si (KR)

(72) Inventors: Hyung Jin Choi, Icheon-si (KR); Jung Hoon Ham, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/300,289

(22) Filed: Apr. 13, 2023

(65) Prior Publication Data
US 2024/0170080 A1    May 23, 2024

(30) Foreign Application Priority Data
Nov. 17, 2022   (KR) .................. 10-2022-0154572

(51) Int. Cl.
*G11C 29/02*    (2006.01)
*G06F 3/06*    (2006.01)

(52) U.S. Cl.
CPC .......... *G11C 29/021* (2013.01); *G06F 3/0619* (2013.01); *G06F 3/0658* (2013.01); *G06F 3/0659* (2013.01); *G06F 3/0679* (2013.01)

(58) Field of Classification Search
CPC ... G11C 29/021; G06F 3/0619; G06F 3/0658; G06F 3/0659; G06F 3/0679
See application file for complete search history.

(56) References Cited

U.S. PATENT DOCUMENTS

2021/0201963 A1*  7/2021  Chun ................. G11C 13/0026
2022/0051714 A1*  2/2022  Bang ................. G11C 16/3418

FOREIGN PATENT DOCUMENTS

KR    1020140073816 A    6/2014
KR    1020210045214 A    4/2021

* cited by examiner

*Primary Examiner* — Thien Nguyen
(74) *Attorney, Agent, or Firm* — WILLIAM PARK & ASSOCIATES LTD.

(57) ABSTRACT

A method of operating a semiconductor device includes performing a pre-sensing operation on selected memory cells; and performing a main sensing operation on the selected memory cells. The performing of the main sensing operation includes selectively precharging first sensing nodes of a plurality of page buffers respectively corresponding to the selected memory cells, based on a result of the pre-sensing operation.

12 Claims, 11 Drawing Sheets

SEMICONDUCTOR DEVICE PERFORMING DATA READ OPERATION AND CONTROLLER CONTROLLING THE SAME

CROSS-REFERENCE TO RELATED APPLICATION

The present application claims priority under 35 U.S.C. § 119(a) to Korean patent application number 10-2022-0154572 filed on Nov. 17, 2022, in the Korean Intellectual Property Office, the entire disclosure of which is incorporated by reference herein.

BACKGROUND

1. Technical Field

The present disclosure generally relates to an electronic device, and more particularly, to a semiconductor device performing a data read operation and a controller controlling the same.

2. Related Art

A semiconductor memory device may be formed in a two-dimensional structure in which strings are arranged horizontally to a semiconductor substrate or may be formed in a three-dimensional structure in which strings are arranged vertically to a semiconductor substrate. A three-dimensional memory device is a memory device devised so as to overcome the limit of degree of integration that is found in two-dimensional semiconductor memory devices and may include a plurality of memory cells vertically stacked above a semiconductor substrate. Meanwhile, a controller may control an operation of the semiconductor memory device.

In a read operation of the semiconductor memory device, a read voltage is applied to a selected word line, and a pass voltage is applied to an unselected word line. Meanwhile, a page buffer connected to each bit line may sense a threshold voltage of a corresponding memory cell, thereby storing bit data representing a sensing result in a latch.

SUMMARY

In accordance with an aspect of the present disclosure, there is provided a method of operating a semiconductor device, the method including: performing a pre-sensing operation on selected memory cells; and performing a main sensing operation on the selected memory cells, wherein the performing of the main sensing operation includes selectively precharging first sensing nodes of a plurality of page buffers respectively corresponding to the selected memory cells, based on a result of the pre-sensing operation.

In accordance with another aspect of the present disclosure, there is provided a method of operating a controller, the method including: transmitting a normal read command to a semiconductor device; receiving first read data corresponding to the normal read command from the semiconductor device; performing an error correction operation on the first read data; and transmitting an accurate read command to the semiconductor device in response to a determination that the error correction operation has failed.

In accordance with still another aspect of the present disclosure, there is provided a method of operating a controller, the method including: determining that data of a semiconductor device is to be read; determining whether the data to be read is data of a first type, among a plurality of types; and transmitting an accurate read command to the semiconductor device in response to a determination that the data to be read is the data of the first type.

In accordance with still another aspect of the present disclosure, there is provided a semiconductor device including: a memory cell array including a plurality of memory cells; a peripheral circuit including a plurality of page buffers each performing a pre-sensing operation and a main sensing operation, which are used to read data stored in selected memory cells, among the plurality of memory cells; and a control logic configured to control the pre-sensing operation and the main sensing operation of the peripheral circuit, wherein, during the main sensing operation, the control logic controls the peripheral circuit to selectively precharge first nodes of the plurality of page buffers respectively corresponding to the selected memory cells, based on a result of the pre-sensing operation.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device capable of improving the accuracy of a read operation, and an operating method the semiconductor device.

Embodiments also provide a controller controlling a semiconductor device to improve the accuracy of a read operation, and an operating method of the controller.

Figure 1:
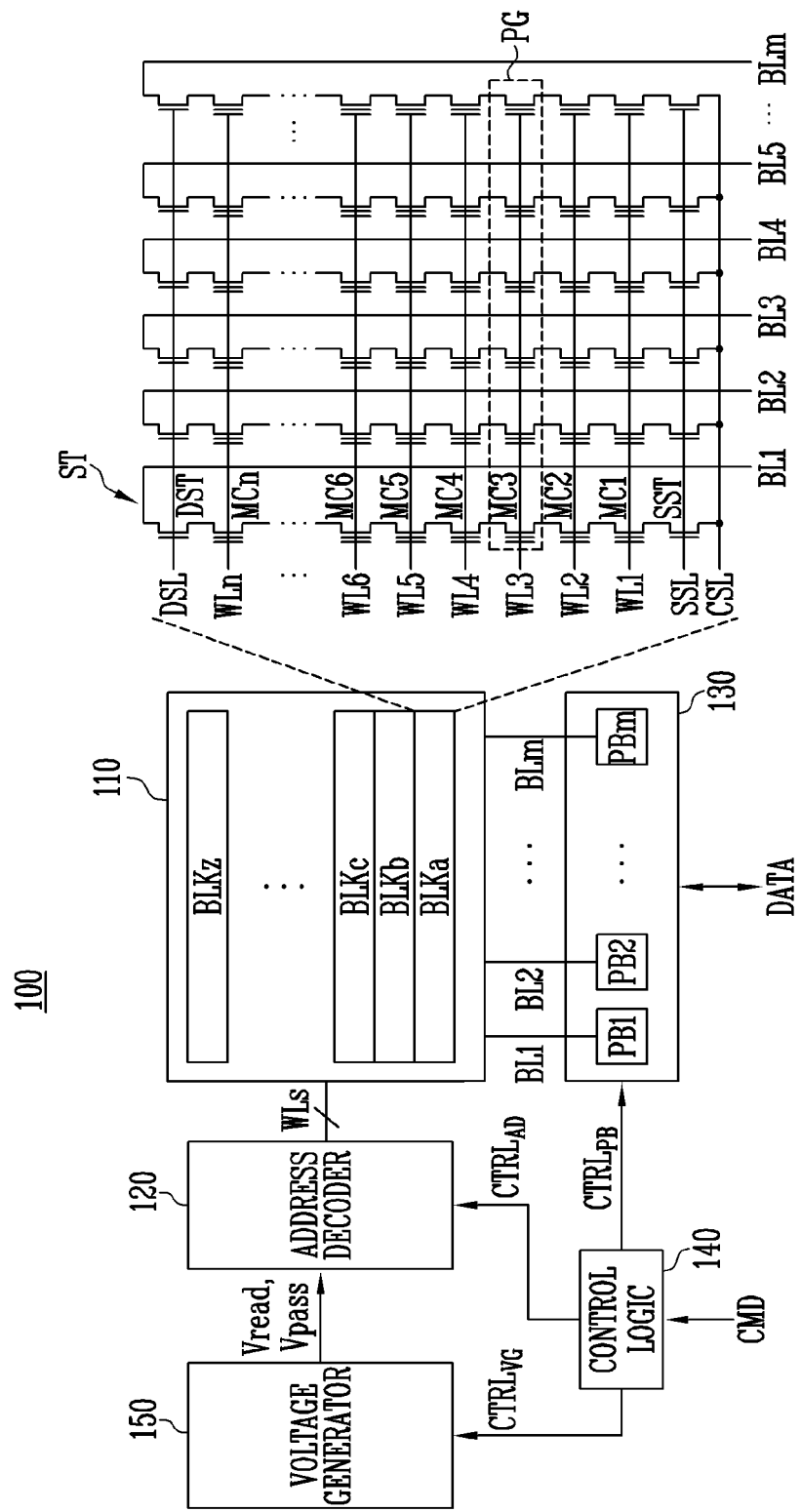
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 100 may include a memory cell array 110, an address decoder 120, a read/write circuit 130, a control logic 140, and a voltage generator 150.

The memory cell array 110 may include a plurality of memory blocks BLKa to BLKz. The plurality of memory blocks BLKa to BLKz may be connected to the address decoder 120 through word lines WLs. The plurality of memory blocks BLKa to BLKz may be connected to the read/write circuit 130 through bit lines BL1 to BLm. Each of the plurality of memory blocks BLKa to BLKz may include a plurality of memory cells. In an embodiment, the plurality of memory cells may be nonvolatile memory cells and may be configured as nonvolatile memory cells having a vertical channel structure.

A structure of a memory block BLKa, among the plurality of memory blocks BLKa to BLKz included in the memory cell array 110, is illustrated in FIG. 1. Referring to FIG. 1, a plurality of word lines WL1 to WLn, arranged in parallel to each other, may be connected between a drain select line DSL and a source select line SSL. More specifically, the memory block BLKa may include a plurality of strings ST connected between the bit lines BL1 to BLm and a common source line CSL. The bit lines BL1 to BLm may be respectively connected to corresponding strings ST. The common source line CSL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MCn, and a drain select transistor DST, which are connected in series to each other between the common source line CSL and the first bit line BL1. At least one source select transistor SST and at least one drain select transistor DST may be included in one string ST.

A source of the source select transistor SST may be connected to the common source line CSL, and a drain of the drain select transistor DST may be connected to the first bit line BL1. The memory cells MC1 to MCn may be connected in series between the source select transistor SST and the drain select transistor DST. Gates of source select transistors SST included in different strings ST may be connected to the source select line SSL, gates of drain select transistors DST of the different strings ST may be connected to the drain select line DSL, and gates of memory cells MC1 to MCn of the different strings ST may be connected to the plurality of word lines WL1 to WLn. A group of memory cells connected to the same word line, among the memory cells included in the different strings ST, may be referred to as a physical page PG. Therefore, physical pages PG corresponding to the number of the word lines WL1 to WLn may be included in the memory block BLKa.

One memory cell may store one-bit data. This is generally designated as a single level cell (SLC). One physical page PG may store one logical page (LPG) data. One LPG data may include data bits corresponding to the number of cells included in one physical page PG.

Meanwhile, one memory cell may store two-or-more-bit data. One physical page PG may store two or more LPG data.

Although the structure of a two-dimensional memory block is illustrated in FIG. 1, the present disclosure is not limited thereto. That is, each of the memory blocks BLKa to BLKz, shown in FIG. 1, may be configured as a three-dimensional memory block.

The address decoder 120, the read/write circuit 130, and the voltage generator 150 may operate as a peripheral circuit for driving the memory cell array 110. The peripheral circuit may perform a read operation, a write operation, and an erase operation on the memory cell array 110 under the control of the control logic 140. The address decoder 120 may be connected to the memory cell array 110 through the word lines WLs. The address decoder 120 may be operated under the control of the control logic 140. Specifically, the control logic 140 may transfer an address decoding control signal CTRL_AD to the address decoder 120, and the address decoder 120 may perform a decoding operation based on the address decoding control signal CTRL_AD.

Also, in a read operation, the address decoder 120 may apply a read voltage Vread generated by the voltage generator 150 to a selected word line and may apply a pass voltage Vpass to the other unselected word lines.

The read/write circuit 130 may include a plurality of page buffers PB1 to PBm. The read/write circuit 130 may operate as a "read circuit" in a read operation and may operate as a "write circuit" in a write operation. The plurality of page buffers PB1 to PBm may be connected to the memory cell array 110 through the bit lines BL1 to BLm. The read/write circuit 130 may perform a read operation on received data DATA in response to a page buffer control signal CTRL_PB output from the control logic 140.

The control logic 140 may be connected to the address decoder 120, the read/write circuit 130, and the voltage generator 150. The control logic 140 may control the address decoder 120, the read/write circuit 130, and the voltage generator 150 to perform an operation corresponding to received command CMD. That is, the control logic 140 may control an operation of the voltage generator 150 through a voltage generation control signal CTRL_vG. Also, the control logic 140 may control an operation of the address decoder 120 through the address decoding control signal CTRL_AD. Meanwhile, the control logic 140 may control operations of the page buffers PB1 to PBm in the read/write circuit 130 through the page buffer control signal $CTRL_{\_PB}$.

The voltage generator 150 may generate the read voltage Vread and the pass voltage Vpass in response to the voltage generation control signal $CTRL_{\_VG}$. The voltage generator 150 may generate various operating voltages. For example, the voltage generator 150 may generate a program voltage used for a program operation and a verify voltage used for a program verify operation. Also, the voltage generator 150 may generate a program pass voltage and a verify pass voltage.

A program operation may be performed in units of pages. Memory cells commonly connected to one word line may constitute a physical page. In an embodiment, the physical page may include at least one logical page. Therefore, page data as data stored in the physical page may include at least one logical page data. For example, when a memory cell is programmed in an SLC mode, the physical page may include one logical page, and the page data may include one logical page data. Alternatively, when a memory cell is programmed in an MLC mode, the physical page may include two logical pages, and the page data may include two logical page data. The two logical page data may be Least significant Bit (LSB) page data and Most Significant Bit (MSB) page data. Alternatively, when a memory cell is programmed in a TLC mode, the physical page may include three logical pages, and the page data may include three logical page data. The three logical page data may be Least significant Bit (LSB) page data, Central Significant Bit (CSB) page data, and Most Significant Bit (MSB) page data.

In a read operation, at least one read voltage may be applied to a selected word line. For example, when a memory cell is programmed in the SLC mode, one read voltage may be applied to the selected word line. In another example, when a memory cell is programmed in the MLC mode, three read voltages may be sequentially applied to the selected word line. Hereinafter, a read operation, when the memory cell is programmed in the MLC mode, will be described.

Figure 2:
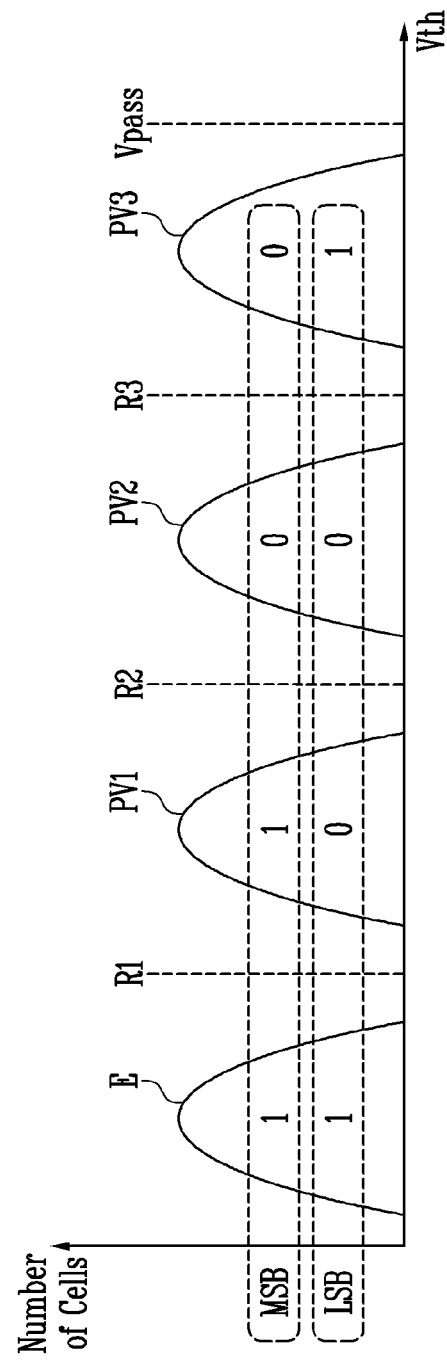
FIG. 2 is a diagram illustrating a threshold voltage distribution of multi-level cells (MLCs) and read voltages for reading data stored in the MLCs.

FIG. 2 is a diagram illustrating a threshold voltage distribution of multi-level cells (MLCs) and read voltages for reading data stored in the MLCs.

Referring to FIG. 2, a data pattern stored in an MLC and a threshold voltage distribution of target states corresponding thereto are exemplarily illustrated. The MLC may store two-bit data including a Most Significant Bit (MSB) and a Least Significant Bit (LSB). In the example shown in FIG. 2, a memory cell corresponding to an erase state E may store a data pattern of "11," a memory cells corresponding to a first program state PV1 may store a data pattern of "10," a memory cell corresponding to a second program state PV2 may store a data pattern of "00," and a memory cell corresponding to a third program state PV3 may store a data pattern of "01." In order to read data of the MLC, first to third read voltages R1 to R3 may be used. For example, the read voltage Vread, shown in FIG. 1, may include the first to third read voltages R1 to R3, shown in FIG. 2. Meanwhile, the pass voltage Vpass may be applied to an unselected word line.

Hereinafter, for convenience of description, a semiconductor memory device and an operation thereof in accordance with the present disclosure will be described based on a program operation on the MLC. However, the present disclosure is not limited thereto, and the semiconductor memory device and the operation thereof may be applied to program operations of a single-level cell (SLC), a triple-level cell (TLC), and the like.

Figure 3:
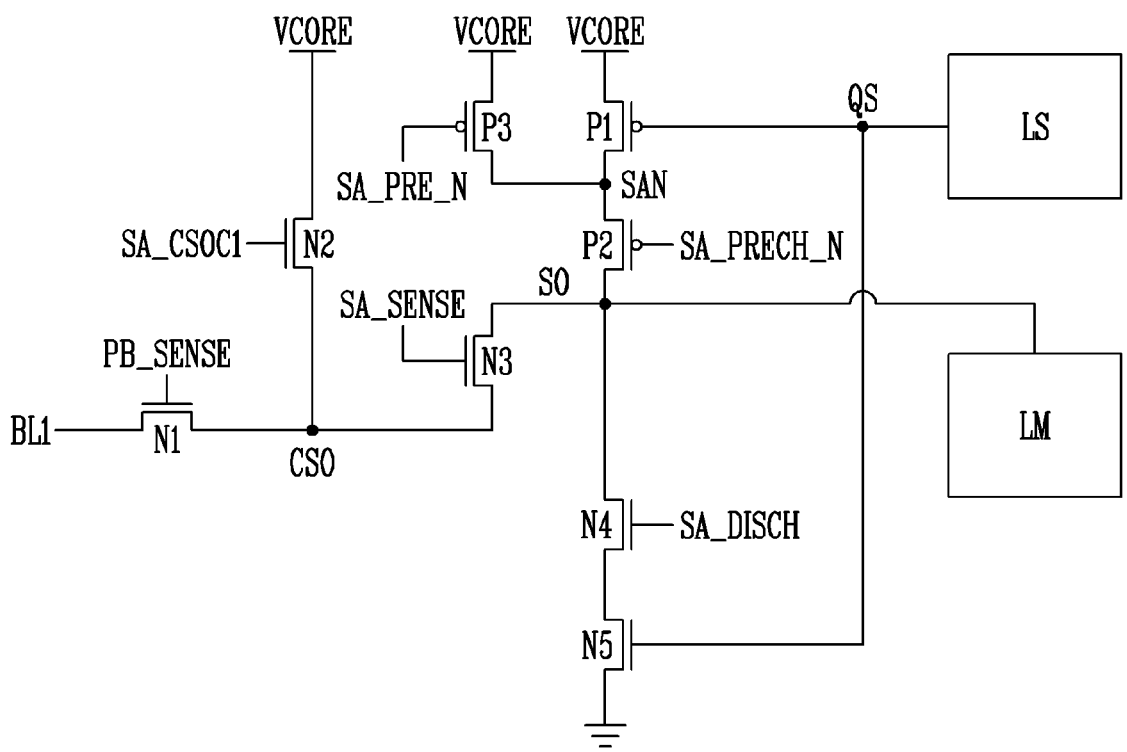
FIG. 3 is a circuit diagram illustrating an exemplary embodiment of a page buffer.

FIG. 3 is a circuit diagram illustrating an exemplary embodiment of a page buffer. For example, a circuit diagram of a page buffer 131a connected to a bit line BL1 is illustrated in FIG. 3. That is, the page buffer 131a, shown in FIG. 3, is an implemented example of the page buffer PB1, shown in FIG. 1.

The page buffer 131a may be operated in response to a signal output from the control logic 140. Signals PB_SENSE, SA_PRECH_N, SA_SENSE, SA_CSOC1, SA_PRE_N, and SA_DISCH, described hereinbelow, may be control signals output from the control logic 140. For example, the page buffer control signal CTRL_p B, shown in FIG. 1, may include the signals PB_SENSE, SA_P-RECH_N, SA_SENSE, SA_CSOC1, SA_PRE_N, and SA_DISCH. The page buffer 131a will be described in detail as follows.

Referring to FIG. 3, the page buffer 131a may be connected to a memory cell through the bit line BL1. Also, the page buffer 131a may include first to fifth NMOS transistors N1 to N5 and first to third PMOS transistors P1 to P3. Also, the page buffer 131a may include a sensing latch circuit LS and a main latch circuit LM. The sensing latch circuit LS may be connected to a node QS. That is, a voltage of the node QS connected to the sensing latch circuit LS may control operations of the first PMOS transistor P1 and the fifth NMOS transistor N5. Meanwhile, the main latch circuit LM may be connected to a node SO.

The first NMOS transistor N1 may be connected between the bit line BL1 and a node CSO and may be controlled by a signal PB_SENSE. The second NMOS transistor N2 may be connected between a power voltage VCORE and the node CSO and may be controlled by a signal SA_CSOC1. The third NMOS transistor N3 may be connected between the node SO and the node CSO and may be controlled by a signal SA_SENSE. The fourth and fifth NMOS transistors N4 and N5 may be connected in series between the node SO and a ground voltage. The fourth NMOS transistor N4 may be controlled by a signal SA_DISCH, and the fifth NMOS transistor N5 may be controlled by the voltage of the node QS.

The first and second PMOS transistor P1 and P2 may be connected in series between the power voltage VCORE and the node SO and may be respectively controlled by the voltage of the node QS and a signal SA_PRECH_N. Also, the first PMOS transistor P1 may be connected to the second PMOS transistor P2 through a node SAN. The third PMOS transistor P3 may be connected between the power voltage VCORE and the node SAN and may be controlled by a signal SA_PRE_N.

In a read operation of the memory cell, the page buffer 131a may precharge the node CSO and the node SO. After that, voltages of the node CSO and the node SO may be changed to have different levels according to a threshold voltage of the memory cell connected to the bit line BL1. In this specification, the node CSO may be designated as a "first sensing node," and the node SO may be designated as a "second sensing node." Also, in the read operation, an operation of precharging the node CSO in the read operation may be designated as a "first sensing node precharge operation," and an operation of precharging the node SO may be designated as a "second sensing node precharge operation."

Meanwhile, in accordance with an embodiment of the present disclosure as illustrated in FIG. 3, the page buffer 131a may include two latch circuits LS and LM. However, various numbers of latch circuits may be included in the page buffer, if necessary. For example, the page buffer may include three or more latch circuits.

Figure 4:
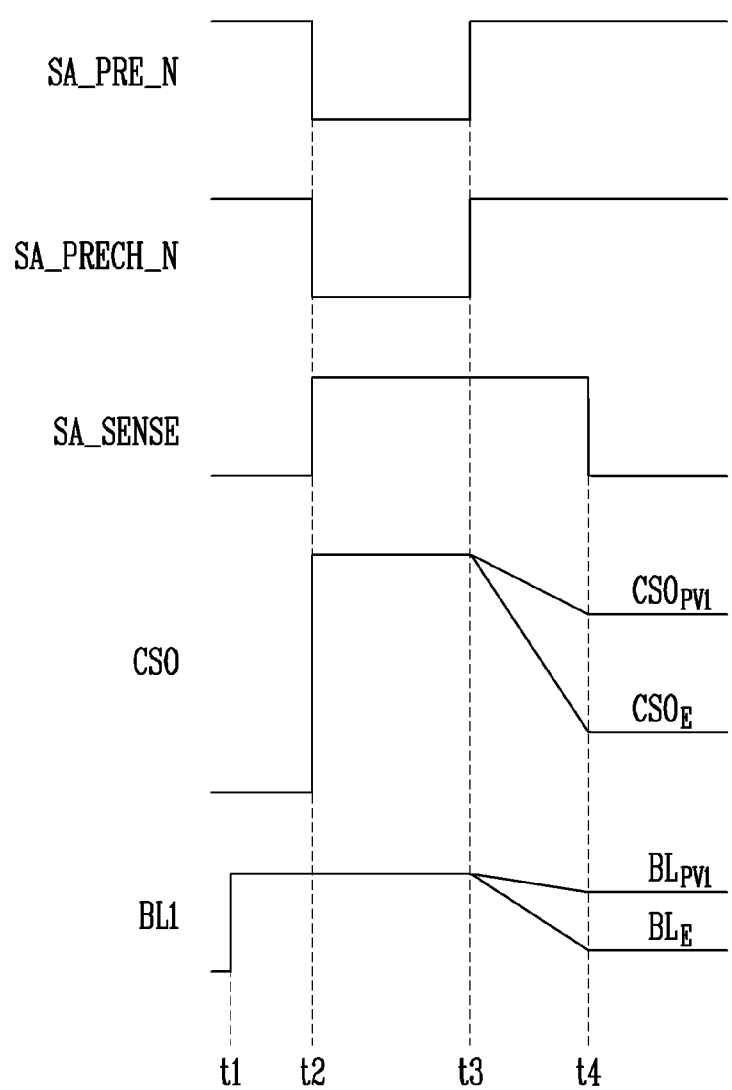
FIG. 4 is a timing diagram illustrating a read operation using the page buffer shown in FIG. 3.

FIG. 4 is a timing diagram illustrating a read operation using the page buffer shown in FIG. 3.

In FIG. 4, signals SA_PRE_N, SA_PRECH_N, and SA_SENSE and voltage changes of the node CSO and the bit line BL1 according thereto in the read operation are illustrated, and illustration of voltages of other signals and other nodes is omitted.

At time t1, the bit line BL1 may be precharged. Although not shown in FIG. 4, exemplarily, the signal PB_SENSE and the signal SA_CSOC1 may be activated to a logic high level, thereby turning on the first and second NMOS transistors N1 and N2. Accordingly, the bit line BL1 may be precharged.

At time t2, the signal SA_PRE_N and the signal SA_P-RECH_N may be activated to a logic low level. Accordingly, the third and second PMOS transistors P3 and P2 may be turned on. Meanwhile, the signal SA_SENSE may be activated to the logic high level at time t2. Accordingly, the third NMOS transistor N3 may be turned on.

Accordingly, the second sensing node, i.e., the node SO may be precharged at time t2. In an embodiment, a voltage level of the node SO may be increased to the power voltage VCORE. In addition, the first sensing node, i.e., the node CSO may be precharged at time t2. In an embodiment, the node CSO may be increased to a voltage level obtained by subtracting a threshold voltage of the third NMOS transistor from a voltage level of the signal SA_SENSE.

At time t3, the signal SA_PRE_N and the signal SA_P-RECH_N may be activated to the logic high level. Accordingly, the third and second PMOS transistors P3 and P2 may be turned off. Meanwhile, during a period from time t3 to time t4, a read voltage may be applied to a selected word line so that the voltage of the node CSO is changed according to a threshold voltage of memory cells connected to each bit line.

For example, when the memory cell connected to the bit line BL1 corresponds to the first program state PV1, and a voltage applied to a word line is the first read voltage R1, the threshold voltage of the memory cell may be higher than the first read voltage V1, and therefore, a voltage of a first sensing node, i.e., a node $CSO_{PV1}$ of the page buffer connected to the bit line may be decreased relatively slowly. On the other hand, when the memory cell connected to the bit line BLK corresponds to the erase state E, the threshold voltage of the memory cell may be lower than the first read voltage R1, and therefore, a voltage of a first sensing node, i.e., a node $CSO_E$ of the page buffer connected to the bit line may be decreased relatively rapidly.

When the voltage of the first sensing node CSO is decreased, this may have influence on the voltage of the connected bit line. For example, when the memory cell connected to the bit line BL1 corresponds to the first program state PV1, and the voltage applied to the word line is the first read voltage R1, the voltage of the node CSOpvi may be decreased relatively slowly, and therefore, a voltage of a corresponding bit line $BL_{Pv}1$ may also be decreased with a relatively small width. On the other hand, when the memory cell connected to the bit line BL1 corresponds to the erase state E, the voltage of the node $CSO_E$ may be decreased relatively rapidly, and therefore, a voltage of a corresponding bit line $BL_E$ may also be decreased with a relatively large width.

After that, at time t4, the signal SA_SENSE may be deactivated to a logic low level. Accordingly, the third NMOS transistor N3 may be turned off, and a voltage of the node CSO of each page buffer may be maintained. Accordingly, bit data representing whether a threshold voltage of each memory cell may be higher than a read voltage, e.g., the first read voltage R1 may be stored in the sensing latch circuit LS. Specifically, a voltage of the node QS of a sensing latch circuit LS of a page buffer connected to memory cells corresponding to the erase state E may become a logic high voltage representing "1." In addition, a voltage of a node QS of a sensing latch circuit LS of a page buffer connected to memory cells corresponding to the first program state PV1 may become a logic low voltage representing "0."

In FIG. 4, a period from time t1 to time t3 may be designated as a "precharge period," a period from time t3 to time t4 may be designated as an "evaluation period," and a period after time t4 may be designated as a "latching period." The bit line BL1 and the first sensing node may be precharged in the precharge period, the voltage of the first sensing node may be changed according to the threshold voltage of the memory cell in the evaluation period, and bit data corresponding to the voltage of the first sensing node may be stored in the sensing latch circuit LS in the latch period.

Referring to FIG. 4, the voltage of the first sensing node, i.e., the node $CSO_E$ of the page buffer connected to the memory cells corresponding to the erase state E may be decreased relatively rapidly in the evaluation period, and accordingly, the voltage of the connected bit line BLE may also be decreased with a relatively large width. That is, a problem in that the accuracy of a read operation of an adjacent memory cell is deteriorated may occur due to a voltage change of the bit line of the memory cells corresponding to the erase state E. Hereinafter, this will be described with reference to FIG. 5, together with FIG. 4.

Figure 5:
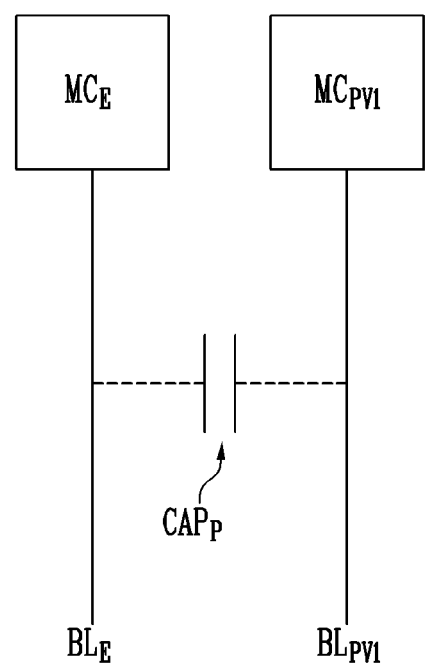
FIG. 5 is a diagram illustrating influence which a memory cell in an erase state has on a read operation of a memory cell in a first program state when the memory cell in the erase state is adjacent to the memory cell in the first program state.

FIG. 5 is a diagram illustrating influence which a memory cell in the erase state has on a read operation of a memory cell in the first program state when the memory cell in the erase state is adjacent to the memory cell in the first program state. Referring to FIG. 5, a memory cell $MC_E$ in the erase state E is connected to the bit line $BL_E$, and a memory cell $MC_{PV1}$ in the first program state PV1 is connected to the bit line $BL_{PV1}$.

As shown in FIG. 5, when the memory cell $MC_E$ in the erase state E is adjacent to the memory cell $MC_{PV1}$ in the first program state PV1, a parasitic capacitance $(CAP_P)$ element may exist between bit lines $BL_E$ and $BL_{PV1}$ corresponding to the memory cells $MC_E$ and $MC_{PV1}$. By the parasitic capacitance $(CAP_P)$ element, a voltage change of the bit line $BL_E$ may have influence on a voltage of the adjacent bit line $BL_{PV1}$. When a voltage of a first sensing node, i.e., a node $CSO_E$ of a page buffer connected to the memory cell $MC_E$ in the erase state E, is decreased with a large width, a voltage of the bit line $BL_E$ connected thereto may also be decreased with a large width, which becomes a main cause in allowing the voltage of the adjacent bit line $BL_{PV1}$ to be decreased. That is, as for the memory cell $MC_{PV1}$, when the memory cell $MC_{PV1}$ is adjacent to the memory cell $MC_E$ in the erase state E, the voltage change of the node $CSO_E$ in the page buffer connected to the memory cell $MC_E$ located adjacent to the memory cell $MC_{PV1}$ acts as noise in data reading of the memory cell $MC_{PV1}$.

When the first sensing node, i.e., the node CSO corresponding to memory cells $MC_E$ in the erase state E, is not precharged, a problem of sensing adjacent memory cells inaccurately due to a parasitic capacitance can be reduced.

In accordance with the embodiment of the present disclosure, in a read operation, memory cells having a relatively low threshold voltage may be determined through a pre-sensing operation. Afterwards, in a main sensing operation, a precharge operation on a first sensing node of a page buffer connected to a memory cell determined to have a relatively low threshold voltage in the pre-sensing operation may be omitted. Accordingly, in the main sensing operation, the sensing accuracy of the memory cell determined to have the relatively low threshold voltage, e.g., a memory cell located adjacent to the memory cells $MC_E$ in the erase state E, can be improved.

Figure 6:
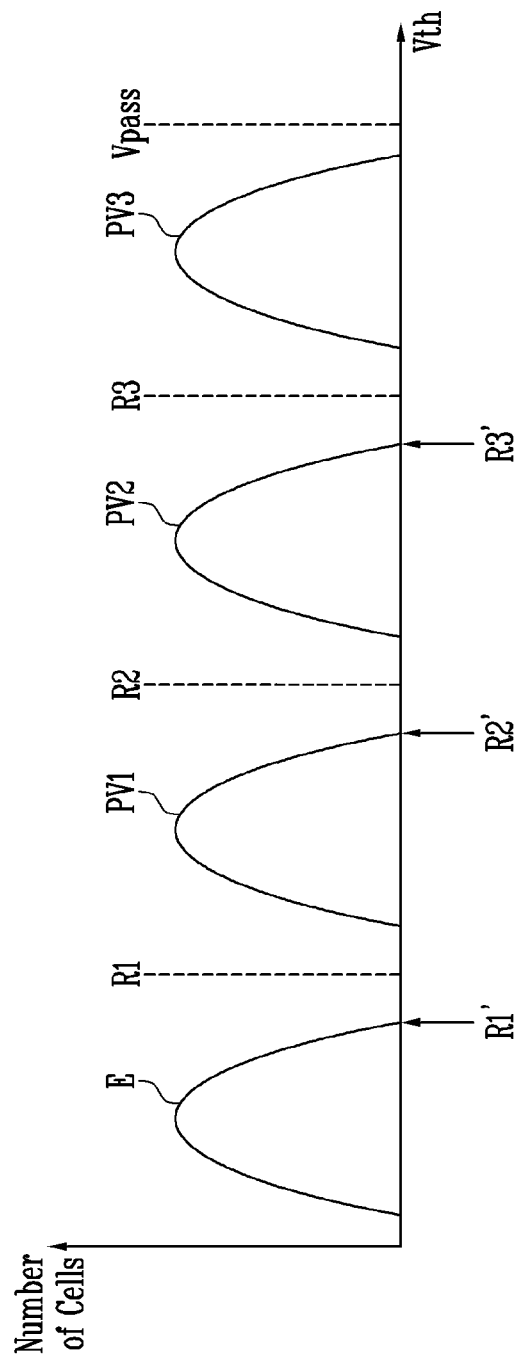
FIG. 6 is a diagram illustrating an auxiliary read voltage for a read operation in accordance with an embodiment of the present disclosure.

FIG. 6 is a diagram illustrating an auxiliary read voltage for a read operation in accordance with an embodiment of the present disclosure.

Referring to FIG. 6, target states of MLCs and first to third read voltages R1 to R3 for a read operation of the MLCs are illustrated. Meanwhile, first to third auxiliary read voltages R1' to R3' respectively corresponding to the first to third read voltages R1 to R3 are also illustrated in FIG. 6.

According to a semiconductor memory device and an operating method thereof in accordance with an embodiment of the present disclosure, the read operation may include a pre-sensing operation and a main sensing operation. In the pre-sensing operation, a sensing operation may be performed using any one of the first to third auxiliary read voltages R1' to R3'. In the main sensing operation, a sensing operation may be performed using any one of main read voltages. In this specification, the first to third main read voltages may be substantially the same as the first to third read voltages R1 to R3.

Referring to FIG. 6, the first auxiliary read voltage R1' may be lower than the first main read voltage R1, the second auxiliary read voltage R2' may be lower than the second main read voltage R2, and the third auxiliary read voltage R3' may be lower than the third main read voltage R3. Although a case in which the first auxiliary read voltage R1' is a voltage in the vicinity of a highest threshold voltage, among threshold voltages of memory cells in the erase state E, is illustrated in FIG. 6, the present disclosure is not limited thereto. For example, the first auxiliary read voltage R1' may be variously selected within a range in which the first auxiliary read voltage R1' is lower than the first main read voltage R1, if necessary. Hereinafter, the first auxiliary read voltage R1' and the first main read voltage R1 will be mainly described.

According to a semiconductor memory device and an operating method thereof in accordance with an embodiment of the present disclosure, the read operation may include a pre-sensing operation and a main sensing operation. In the pre-sensing operation, a sensing operation may be performed using the first auxiliary read voltage R1'. A result of the pre-sensing operation may be stored in the sensing latch circuit LS, shown in FIG. 3. Afterwards, in the main sensing operation, a sensing operation may be performed using the first main read voltage R1. In the main sensing operation, a first sensing node CSO in a page buffer may be selectively precharged using the result of the pre-sensing operation. Specifically, a first sensing node CSO of a page buffer connected to a memory cell having a threshold voltage lower than the first auxiliary read voltage R1' as the result of the pre-sensing operation might not be precharged. Meanwhile, a first sensing node CSO of a page buffer connected to a memory cell having a threshold voltage higher than the first auxiliary read voltage R1' as the result of the pre-sensing operation may be precharged. Hereinafter, this will be described with reference to FIG. 7.

Figure 7:
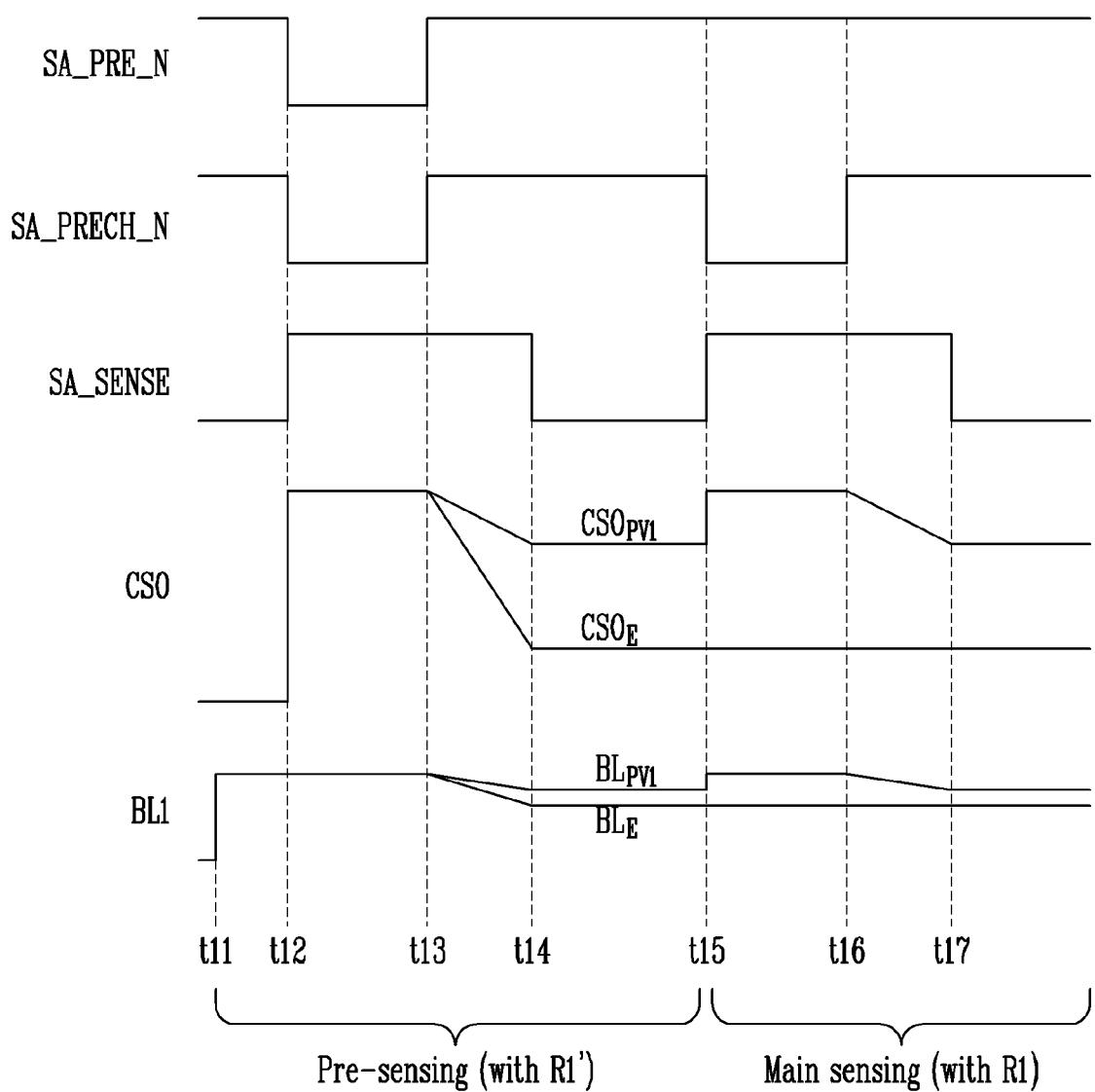
FIG. 7 is a timing diagram illustrating a read operation in accordance with an embodiment of the present disclosure.

FIG. 7 is a timing diagram illustrating a read operation in accordance with an embodiment of the present disclosure.

In FIG. 7, signals SA_PRE_N, SA_PRECH_N, and SA_SENSE and voltage changes of the node CSO and the bit line BL1 according thereto in the read operation are illustrated, and illustration of voltages of other signals and other nodes is omitted.

The read operation in accordance with the embodiment of the present disclosure may include a pre-sensing operation and a main sensing operation. Referring to FIG. 7, the pre-sensing operation may be performed during a period from time t11 to time t15. In addition, the main sensing operation may be performed during a period from time t15 to time t17. During the pre-sensing operation, the first auxiliary read voltage R1' may be applied to a selected word line. In addition, during the main sensing operation, the first main read voltage R1 may be applied to the selected word line.

Specifically, at time t11, the bit line BL1 may be precharged. Exemplarily, the signal PB_SENSE and the signal SA_CSOC1 may be activated to a logic high level, thereby turning on the first and second NMOS transistors N1 and N2. Accordingly, the bit line BL1 may be precharged.

At time t12, the signal SA_PRE_N and the signal SA_P-RECH_N may be activated to a logic low level. Accordingly, the first and second sensing nodes CSO and SO may be precharged at time t12.

At time t13, the signal SA_PRE_N and the signal SA_P-RECH_N may be activated to the logic high level. Accordingly, the third and second PMOS transistors P3 and P2 may be turned off. Meanwhile, during a period from time t13 to time t14, a read voltage may be applied to the selected word line so that the voltage of the first sensing node CSO is changed according to a threshold voltage of memory cells connected to each bit line.

After that, at time t14, the signal SA_SENSE may be deactivated to the logic low level. Accordingly, the third NMOS transistor N3 may be turned off, and a voltage of a node CSO of each page buffer may be maintained. Accordingly, bit data representing whether a threshold voltage of each memory cell is higher than the first auxiliary read voltage R1' may be stored in the sensing latch circuit LS. Specifically, a voltage of a node QS of a sensing latch circuit LS of a page buffer connected to memory cells having a threshold voltage lower than the first auxiliary read voltage R1' may become a logic high voltage representing "1." In addition, a voltage of a node QS of a sensing latch circuit LS of a page buffer connected to memory cells having a threshold voltage higher than the first auxiliary read voltage R1' may become a logic low voltage representing "0."

In a state in which a result of the pre-sensing operation is stored in the sensing latch circuit LS, the main sensing operation may be performed at time t15. Specifically, at time t15, a bit line $BL_{PV1}$ connected to a memory cell having a threshold voltage higher than the first auxiliary read voltage R1' may be precharged. On the other hand, at time t15, a bit line $BL_E$ connected to a memory cell having a threshold voltage lower than the first auxiliary read voltage R1' might not be precharged. Also, at time t15, the signal SA_P-RECH_N may be activated to the logic low level, and therefore, the first and second sensing nodes CSO and SO may be selectively precharged. More specifically, at time t15, a first sensing node CSOpvi of a page buffer connected to a memory cell having a threshold voltage higher than the first auxiliary read voltage R1' may be precharged. On the other hand, at time t15, a first sensing node $CSO_E$ of a page buffer connected to a memory cell having a threshold voltage lower than the first auxiliary read voltage R1' might not be precharged.

After that, at time t16, the signal SA_PRECH_N may be deactivated to the logic high level. Accordingly, the second PMOS transistor P2 may be turned off. Meanwhile, during a period from time t16 to time t17, as a read voltage is applied to the selected word line, the voltage of the first sensing node CSO may be changed according to a threshold voltage of memory cells connected to each bit line. However, a voltage of a first sensing node $CSO_E$ of a page buffer connected to a memory cell having a threshold voltage lower than the first auxiliary read voltage R1' may be maintained during the period from time t16 to time t17.

After that, time t17, the signal SA_SENSE may be deactivated to the logic low level. Accordingly, bit data representing whether a threshold voltage of each memory cell is higher than the first main read voltage R1 may be stored in the sensing latch circuit LS. Specifically, in the pre-sensing operation, bit data representing whether a threshold voltage of memory cells determined to have the threshold voltage higher than the first auxiliary read voltage R1' is higher than the first main read voltage R1 may be stored in the sensing latch circuit LS. Meanwhile, in the pre-sensing operation, data of a sensing latch circuit LS corresponding to memory cells determined to have a threshold voltage lower than the first auxiliary read voltage R1' may be maintained.

Hereinafter, an operation of a page buffer connected to a memory cell in the erase state in the main sensing operation will be described with reference to FIG. 7 together with FIG. 3. First, an operation of a page buffer connected to a memory cell determined to have a threshold voltage lower than the first auxiliary read voltage R1' will be described.

As described above, a voltage of a node QS of a sensing latch circuit LS corresponding to a memory cell determined to have a threshold voltage lower than the first auxiliary read voltage R1' in the pre-sensing operation may be the logic high voltage representing "1." Accordingly, the first PMOS transistor P1 applied with a gate voltage from the node QS may be turned off. Therefore, a current path including the first and second PMOS transistors P1 and P2 and the third NMOS transistor N3 may be blocked. Accordingly, the voltage of the first sensing node CSO may become a voltage value obtained by subtracting a threshold voltage of the second NMOS transistor N2 from an activation voltage level of the signal SA_CSOC1. As a result, the voltage of the first sensing node CSO may maintain a small value. Accordingly, the voltage of the bit line BL1 may also maintain a small value.

Meanwhile, hereinafter, an operation of a page buffer connected to the memory cell in the first program state in the main sensing operation will be described. That is, an operation of a page buffer connected to a memory cell determined to have a threshold voltage higher than the first auxiliary read voltage R1' in the main sensing operation will be described.

As described above, a voltage of a node QS of a sensing latch circuit LS corresponding to the memory cell determined to have the threshold voltage higher than the first auxiliary read voltage R1' in the pre-sensing operation may be the logic low voltage representing "0." Accordingly, the first PMOS transistor P1 applied with the gate voltage from the node QS may be turned on. Therefore, the current path including the first and second PMOS transistors P1 and P2 and the third NMOS transistor N3 may be opened. Thus, the first sensing node CSO may be precharged through the first and second PMOS transistors P1 and P2 and the third NMOS transistor N3. Accordingly, the bit line BL1 may also be precharged.

As described above, according to the semiconductor memory device and the operating method thereof in accordance with the embodiment of the present disclosure, memory cells having a threshold voltage lower than an auxiliary read voltage may be determined by the pre-sensing operation. After that, a first sensing node CSO of a page buffer connected to memory cells having a threshold voltage lower than the auxiliary read voltage in the main sensing operation might not be precharged. Thus, influence of noise caused by adjacent erased cells in the main sensing operation can be minimized.

Meanwhile, according to a controller in accordance with an embodiment of the present disclosure, in data reading, any one of a normal read command and an accurate read command may be selectively transferred to the semiconductor memory device 100, if necessary. The semiconductor memory device 100 may perform a normal read operation or an accurate read operation according to the received normal read command or the accurate read command, which will be described in more detail with reference to FIGS. 8 to 11.

Figure 8:
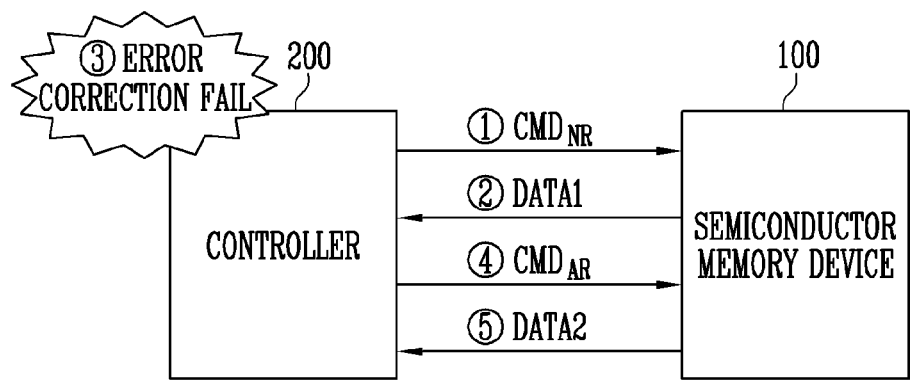
FIG. 8 is a diagram exemplarily illustrating operations of a controller and the semiconductor memory device in accordance with an embodiment of the present disclosure.

FIG. 8 is a diagram exemplarily illustrating operations of the controller and the semiconductor memory device in accordance with an embodiment of the present disclosure. Referring to FIG. 8, the controller 200 and the semiconductor memory device 100 may be operated as follows.

First, the controller 200 may transfer a normal read command $CMD_{NR}$ to the semiconductor memory device 100 (①). The normal read command $CMD_{NR}$ may be a read command for controlling the semiconductor memory device 100 to perform a normal read operation. Also, the normal read operation may be the read operation described with reference to FIGS. 3 to 5. That is, in the normal read operation, noise according to a voltage change of a node $CSO_E$ in a page buffer connected to the memory cell $MC_E$ that is adjacent thereto may occur. This means that read data according to the normal read operation may include a relatively large number of errors.

The semiconductor memory device 100 may perform the normal read operation in response to the received normal read command. Meanwhile, the semiconductor memory device 100 may transfer, to the controller 200, read data DATA1 acquired by performing the normal read operation (②). That is, the controller 200 may receive the read data DATA1 from the semiconductor memory device 100.

The controller 200 may perform an error correction operation on the received read data DATA1. When the error correction operation succeeds, any additional read operation might not be performed. A case in which the error correction operation on the received read data DATA1 fails is illustrated in FIG. 8 (③). As described above, noise according to a voltage change of a node $CSO_E$ in a page buffer connected to the memory cell $MC_E$ that is adjacent thereto in the normal read operation may occur, which can result in an error correction fail in the controller 200.

When the error correction operation fails, the controller 200 may transfer an accurate read command $CMD_{AR}$ to the semiconductor memory device 100 (④). In this specification, the accurate read command $CMD_{AR}$ may mean a read command for controlling the semiconductor memory device 100 to perform an accurate read operation. More specifically, the accurate read operation may mean the read operation described with reference to FIGS. 6 and 7. According to the accurate read operation, the semiconductor memory device 100 may perform a read operation including a pre-sensing operation and a main sensing operation. As described above, memory cells having a relatively low threshold voltage may be determined through the pre-sensing operation. After that, in the main sensing operation, a precharge operation on a first sensing node of a page buffer connected to a memory cell determined to have a relatively low threshold voltage in the pre-sensing operation may be omitted. Accordingly, in the main sensing operation, the sensing accuracy of a memory cell determined to have a relatively low threshold voltage, e.g., a memory cell located adjacent to memory cells $MC_E$ in the erase state E can be improved.

The semiconductor memory device 100 may perform the accurate read operation in response to the received accurate read command. Meanwhile, the semiconductor memory device 100 may transfer, to the controller 200, read data DATA2 acquired by performing the accurate read operation (⑤). That is, the controller 200 may receive the read data DATA2 from the semiconductor memory device 100.

The read data DATA1 according to the normal read operation may include a relatively large number of error bits caused by noise, and the read data DATA2 according to the accurate read operation may include a relatively small number of error bits caused by noise. Thus, in the case of the read data DATA2 according to the accurate read operation, the probability that an error correction fail will occur may be lower.

Figure 9:
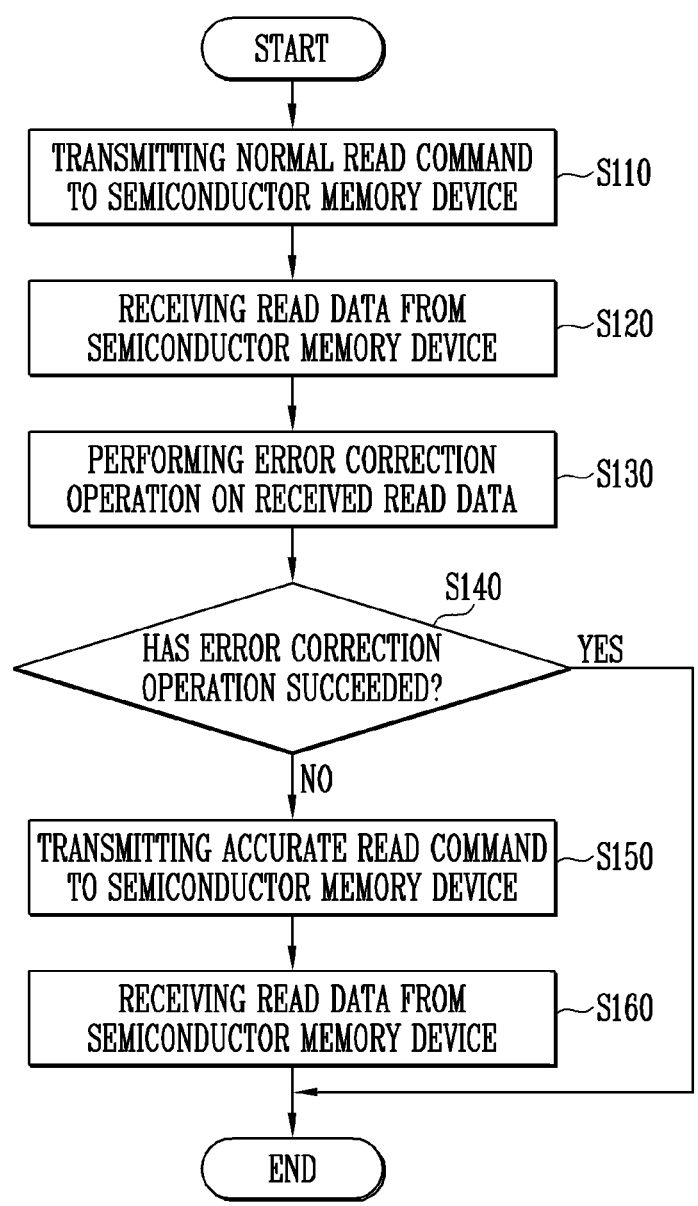
FIG. 9 is a flowchart illustrating an operating method of the controller in accordance with another embodiment of the present disclosure.

FIG. 9 is a flowchart illustrating an operating method of the controller in accordance with another embodiment of the present disclosure.

Referring to FIG. 9, the operating method of the controller 200 in accordance with another embodiment of the present disclosure may include step S110 of transmitting a normal read command to the semiconductor memory device 100, step S120 of receiving read data from the semiconductor memory device 100, step S130 of performing an error correction operation on the received read data, and step S140 of determining whether the error correction operation succeeds. When the error correction operation succeeds (S140: YES), the operating method of the controller 200 may be ended. Meanwhile, the operating method of the controller 200 in accordance with this embodiment of the present disclosure may further include step S150 of transmitting an accurate read command to the semiconductor memory device 100 when the error correction operation fails (S140: NO) and step S160 of receiving read data from the semiconductor memory device 100.

In the step S110, the controller 200 may transmit a normal read command to the semiconductor memory device 100. As described above, the normal read command may be a read command for controlling the semiconductor memory device 100 to perform a normal read operation. Also, the normal read operation may be the read operation described with reference to FIGS. 4 to 6. When the controller 200 transmits the normal read command to the semiconductor memory device 100 (S110), the semiconductor memory device 100 may perform the normal read operation in response to the normal read command. Also, the semiconductor memory device 100 may transfer, to the controller 200, read data acquired by performing the normal read operation.

In the step S120, the controller 200 may receive read data from the semiconductor memory device 100. The read data received in the step S120 may be read data computed by the normal read operation. Therefore, a relatively large number of errors may be included in the read data received in the step S120.

In the step S130, the controller 200 may perform an error correction operation on the received read data. When an error included in the read data exceeds an error correction ability of an error correction code (ECC), the error correction operation may fail. On the other hand, when the error included in the read data is within an error correction ability range of the ECC, the error correction operation may succeed.

In the step S140, it may be determined whether the error correction operation on the received read data has succeeded. When the error correction operation succeeds (S140: YES), data obtained by removing the error from the received read data has been acquired, and therefore, the operating method of the controller 200 may be ended.

When the error correction operation fails (S140: NO), it is necessary for the controller 200 to control the semiconductor memory device 100 to perform a read operation in a more accurate manner. Accordingly, the controller 200 may transmit an accurate read command to the semiconductor memory device. As described above, the accurate read command may be a read command for controlling the semiconductor memory device 100 to perform an accurate read operation. That is, according to the accurate read operation, the semiconductor memory device 100 may perform a read operation including a pre-sensing operation and a main sensing operation. As described above, memory cells having relatively low threshold voltage may be determined through the pre-sensing operation. After that, in the main sensing operation, a precharge operation on a first sensing node of a page buffer connected to a memory cell determined to have a relatively low threshold voltage in the pre-sensing operation may be omitted. Accordingly, in the main sensing operation, the sensing accuracy of a memory cell determined to have a relatively low threshold voltage, e.g., a memory cell located adjacent to memory cells $MC_E$ in the erase state E, can be improved.

In the main sensing operation of the accurate read operation, noise according to a voltage change of a node $CSO_E$ in a page buffer connected to a memory cell $MC_E$ that is adjacent thereto can be minimized, which results in the read data according to the accurate read operation including a relatively small number of errors. When the controller 200 transmits the accurate read command to the semiconductor memory device 100 (S150), the semiconductor memory device 100 may perform the accurate read operation in response to the accurate read command. Also, the semiconductor memory device 100 may transmit, to the controller 200, read data acquired by performing the accurate read operation.

In the step S160, the controller 200 may receive read data from the semiconductor memory device 100. The read data received in the step S160 may be read data computed by the accurate read operation. Therefore, a relatively small number of error bits may be included in the read data received in the step S160. Although not shown in FIG. 9, after the step S160, the controller 200 may perform an error correction operation on the read data received in the step S160. Since a relatively small number of errors are included in the read data received in the step S160, a probability that the error correction operation performed after the step S160 will succeed will be higher than a probability that the error correction operation according to the step S130 will succeed.

Figure 10:
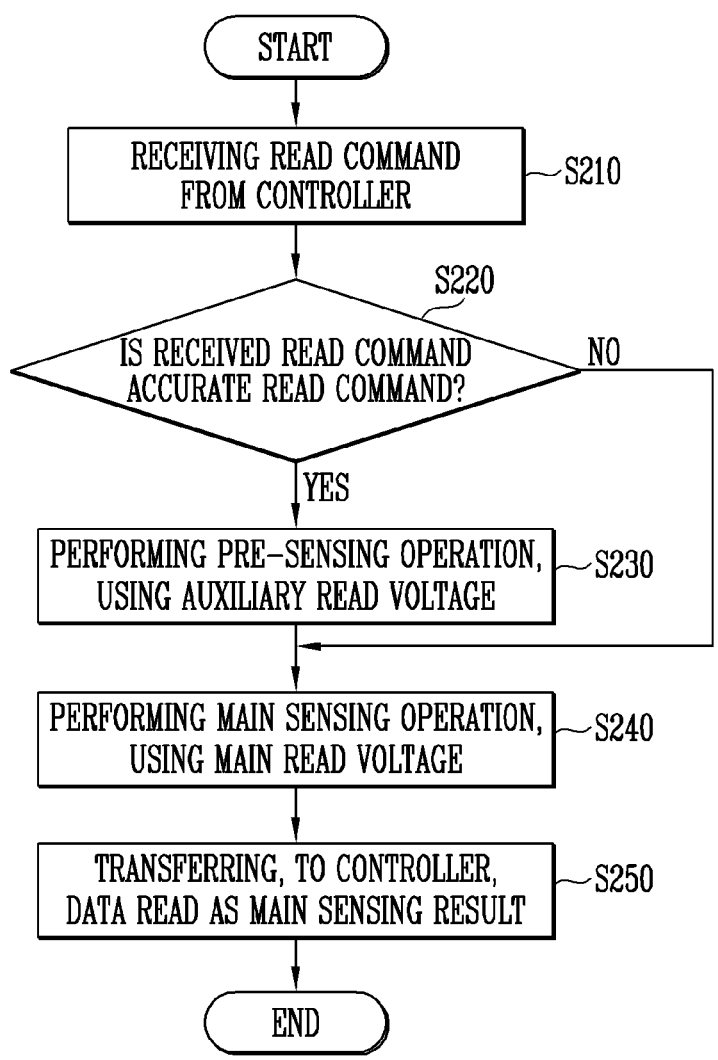
FIG. 10 is a flowchart illustrating an operating method of the semiconductor memory device in accordance with still another embodiment of the present disclosure.

FIG. 10 is a flowchart illustrating an operating method of the semiconductor memory device in accordance with still another embodiment of the present disclosure.

Referring to FIG. 10, the operating method of the semiconductor memory device 100 in accordance with this embodiment of the present disclosure may include step S210 of receiving a read command from the controller 200, step S220 of determining whether the received read command is an accurate read command, step S230 of performing a pre-sensing operation using an auxiliary read voltage, step S240 of performing a main sensing operation using a main read voltage, and step S250 of transferring, to the controller 200, data read as a main sensing result.

In the step S210, the semiconductor memory device 100 may receive a read command from the controller 200. The read command received from the controller 200 may be a normal read command or an accurate read command. The semiconductor memory device 100 may perform different read operations according to a type of the received read command.

Specifically, when the received read command is the accurate read command (S220: YES), the semiconductor memory device 100 may perform a pre-sensing operation using an auxiliary read voltage (S230). The pre-sensing operation may be the sensing operation performed during the period from time t11 to time t15, shown in FIG. 7. The pre-sensing operation may be performed so that memory cells having a threshold voltage lower than the auxiliary read voltage can be determined.

After the step S230, the semiconductor memory device 100 may perform a main sensing operation using a main read voltage (S240). The main sensing operation performed after the step S230 may be the sensing operation performed during the period from time t15 to time t17 shown in FIG. 7. In the main sensing operation (S240) performed after the step S230, a first sensing node CSO of a page buffer connected to a memory cell having a threshold voltage lower than the auxiliary read voltage might not be precharged. On the other hand, in the main sensing operation (S240) performed after the step S230, a first sensing node CSO of a page buffer connected to a memory cell having a threshold voltage higher than the auxiliary read voltage may be precharged. That is, the read operation including both the pre-sensing operation of the step S230 and the main sensing operation of the step S240 may be an accurate read operation.

Meanwhile, when the received read command is the normal read command (S220: NO), the semiconductor memory device 100 might not perform the pre-sensing operation but may perform the main sensing operation (S240). The main sensing operation (S240) performed according to the reception of the normal read command may mean the above-described normal read operation. That is, the main sensing operation (S240) performed without the pre-sensing operation may correspond to the sensing operation performed during the period from time t1 to time t4, shown in FIG. 4.

After the main sensing operation (S240) has been performed, the semiconductor memory device 100 may transfer, to the controller 200, data read as a main sensing result (S250).

Through FIGS. 8 to 10, an exemplary embodiment of the operating method of the controller 200 controlling the semiconductor memory device 100 to selectively perform the normal read operation or the accurate read operation has been described. However, the present disclosure is not limited thereto, and the controller 200 may control the normal read operation or the accurate read operation of the semiconductor memory device 100 for other various purposes. Hereinafter, this will be described with reference to FIG. 11.

Figure 11:
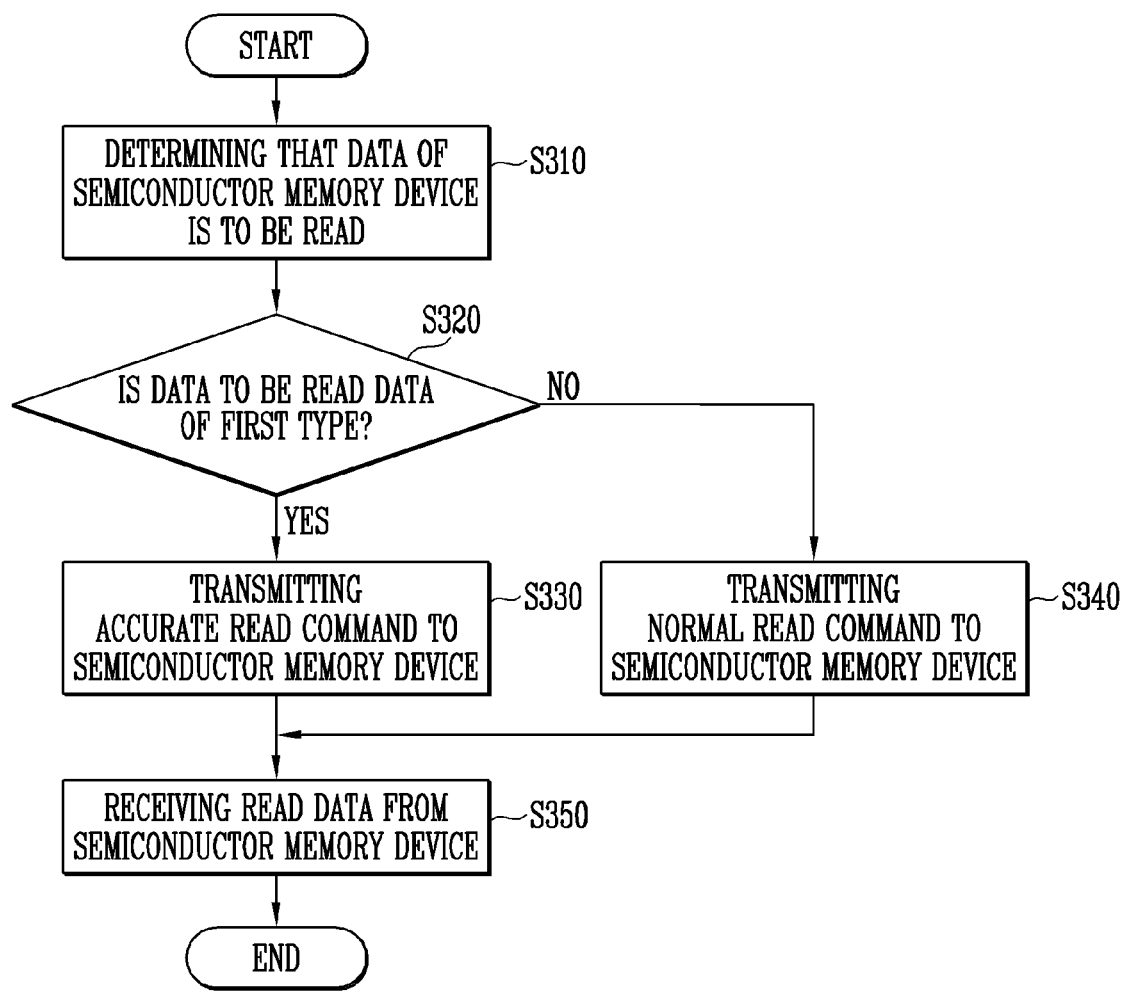
FIG. 11 is a flowchart illustrating an operating method of the controller in accordance with still another embodiment of the present disclosure.

FIG. 11 is a flowchart illustrating an operating method of the controller in accordance with still another embodiment of the present disclosure.

Referring to FIG. 11, the operating method of the controller 200 in accordance with this embodiment of the present disclosure may include step S310 of determining whether data of the semiconductor memory device 100 is to be read, step S320 of determining whether the data to be read is data of a first type, step S330 of transmitting an accurate read command to the semiconductor memory device 100 when the data to be read is the data of the first type (S320: YES), step S340 of transmitting a normal read command to the semiconductor memory device 100 when the data to be read is not the data of the first type but is data of a second type (S320: NO), and step S350 of receiving read data from the semiconductor memory device 100.

In accordance with the embodiment shown in FIG. 9, the semiconductor memory device may primarily perform a normal read operation in data reading, and the controller 200 may control the semiconductor memory device such that the semiconductor memory device 100 secondarily performs an accurate read operation when an error correction operation on data read as a result obtained by performing the normal read operation fails. On the other hand, in accordance with the embodiment, shown in FIG. 11, a kind of read operation that the semiconductor memory device is to perform according to a type of data to be read may be determined. For example, when the accuracy of a read operation is to be ensured even though it takes a relatively long time to perform the read operation, such data may be defined as data of a first type. Meanwhile, when a fast read speed is required as compared with the accuracy of the read operation, such data may be defined as data of a second type. The type of each data may be determined when data is written in the semiconductor memory device 100. Data representing whether data stored in the semiconductor memory device 100 is of the first type or the second type may be stored in the controller 200. In an example, it may be determined whether data is of the first type or the second type according to an address of the corresponding data. The controller 200 may determine whether data to be read is of the first type or the second type, based on a physical address of the data.

First, the controller 200 may determine that data located at a specific address of the semiconductor memory device 100 is to be read (S310). As described above, based on the physical address of the data, the controller 200 may determine whether the data to be read is of a first type or a second type. When the data to be read is data of the first type (S320: YES), the controller 200 may transmit an accurate read command to the semiconductor memory device 100 (S330). The semiconductor memory device 100 may perform an accurate read operation in response to the accurate read command. Data read as a result obtained by performing the accurate read operation may be received from the semiconductor memory device 100 to the controller 200 (S350).

On the other hand, when the data to be read is data of the second type (S320: NO), the controller 200 may transmit a normal read command to the semiconductor memory device 100 (S340). The semiconductor memory device 100 may perform a normal read operation in response to the normal read command. Data read as a result obtained by performing the normal read operation may be received from the semiconductor memory device 100 to the controller 200 (S350).

In accordance with the present disclosure, a semiconductor device and an operating method thereof may be provided that is capable of improving the accuracy of a read operation.

In accordance with the present disclosure, a controller and an operating method thereof may be provided that controls a semiconductor device to improve the accuracy of a read operation.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A method of operating a semiconductor device, the method comprising:
 performing a pre-sensing operation on selected memory cells; and
 performing a main sensing operation on the selected memory cells,
 wherein the performing of the main sensing operation includes precharging first sensing nodes of page buffers connected to memory cells having a threshold voltage higher than an auxiliary read voltage which is applied during the pre-sensing operation among the selected memory cells based on a result of the pre-sensing operation.

2. The method of claim 1, wherein the pre-sensing operation on the selected memory cells is performed using the auxiliary read voltage, and
 wherein the main sensing operation on the selected memory cells is performed using a main read voltage that is higher than the auxiliary read voltage.

3. The method of claim 2, wherein the performing of the pre-sensing operation includes:
 applying the auxiliary read voltage to a selected word line connected to the selected memory cells;
 precharging the first sensing nodes of the page buffers respectively connected to the selected memory cells; and
 storing data representing whether a threshold voltage of the selected memory cells is higher than the auxiliary read voltage.

4. The method of claim 3, wherein the performing of the main sensing operation includes:
 applying the main read voltage to the selected word line; and
 storing data representing whether the threshold voltage of the selected memory cells is higher than the main read voltage.

5. A semiconductor device comprising:
 a memory cell array including a plurality of memory cells;
 a peripheral circuit including a plurality of page buffers each performing a pre-sensing operation and a main sensing operation, which are used to read data stored in selected memory cells, among the plurality of memory cells; and
 a control logic configured to control the pre-sensing operation and the main sensing operation of the peripheral circuit,
 wherein, during the main sensing operation, the control logic controls the peripheral circuit to precharge first nodes of page buffers connected to memory cells having a threshold voltage higher than an auxiliary read voltage which is applied during the pre-sensing operation among the selected memory cells based on a result of the pre-sensing operation.

6. The semiconductor device of claim 5, wherein the control logic controls the peripheral circuit to apply the auxiliary read voltage to a selected word line connected to the selected memory cells during the pre-sensing operation and to apply a main read voltage that is higher than the auxiliary read voltage to the selected word line during the main sensing operation.

7. The semiconductor device of claim 6, wherein each of the plurality of page buffers includes a latch circuit, and
 wherein the control logic controls the peripheral circuit to store the result of the pre-sensing operation in the latch circuit.

8. The semiconductor device of claim 7, wherein, during the main sensing operation, the control logic controls the peripheral circuit to not precharge a first node of a page buffer corresponding to memory cells, among the selected memory cells, having a threshold voltage lower than the auxiliary read voltage.

9. The semiconductor device of claim 7, wherein each of the plurality of page buffers further includes:
 a first transistor connected between a bit line and a first node;
 a second transistor connected between a power voltage and the first node;
 a third transistor connected between the first node and a second node;
 a fourth transistor connected between the second node and a third node; and
 fifth and sixth transistors connected in parallel between the power voltage and the third node, and
 wherein the latch circuit is connected to a gate of the fifth transistor.

10. The semiconductor device of claim 9, wherein the first to third transistors are NMOS transistors, and
 wherein the fourth to sixth transistors are PMOS transistors.

11. The semiconductor device of claim 9, wherein the fifth transistor of a page buffer connected to memory cells determined to have a threshold voltage lower than the auxiliary read voltage as the result of the pre-sensing operation is turned off in the main sensing operation.

12. The semiconductor device of claim 9, wherein the fifth transistor of a page buffer connected to memory cells determined to have a threshold voltage higher than the auxiliary read voltage as the result of the pre-sensing operation is turned on in the main sensing operation.

* * * * *